(12) United States Patent
Brandman et al.

(10) Patent No.: US 7,558,109 B2
(45) Date of Patent: Jul. 7, 2009

(54) NONVOLATILE MEMORY WITH VARIABLE READ THRESHOLD

(75) Inventors: Yigal Brandman, Los Altos Hills, CA (US); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 75 days.

(21) Appl. No.: 11/556,626

(22) Filed: Nov. 3, 2006

(65) Prior Publication Data

US 2008/0123420 A1    May 29, 2008

(51) Int. Cl.
G11C 16/04    (2006.01)
(52) U.S. Cl. .............................. 365/185.03; 365/185.22; 365/185.28; 365/236
(58) Field of Classification Search ............ 365/185.03, 365/185.28, 185.29, 236, 185.02, 185.22
See application file for complete search history.

(56) References Cited

U.S. PATENT DOCUMENTS

| | | | |
|---|---|---|---|
| 5,043,940 A | 8/1991 | Harari .................... | 365/185.03 |
| 5,070,032 A | 12/1991 | Yuan et al. .................. | 438/267 |
| 5,095,344 A | 3/1992 | Harari ......................... | 257/328 |
| 5,172,338 A | 12/1992 | Mehrotra et al. ........ | 365/185.03 |
| 5,313,421 A | 5/1994 | Guterman et al. ....... | 365/185.15 |
| 5,315,541 A | 5/1994 | Harari et al. ............ | 365/185.13 |
| 5,343,063 A | 8/1994 | Yuan et al. .................. | 257/317 |
| 5,532,962 A | 7/1996 | Auclair et al. .............. | 365/201 |
| 5,570,315 A | 10/1996 | Tanaka et al. ........... | 365/185.22 |
| 5,657,332 A | 8/1997 | Auclair et al. .............. | 714/763 |
| 5,661,053 A | 8/1997 | Yuan .......................... | 438/257 |
| 5,774,397 A | 6/1998 | Endoh et al. ........... | 365/185.19 |
| 5,909,449 A | 6/1999 | So et al. ...................... | 714/721 |
| 5,930,167 A | 7/1999 | Lee et al. ................ | 365/185.03 |
| 6,046,935 A | 4/2000 | Takeuchi et al. ........ | 365/185.03 |
| 6,222,762 B1 | 4/2001 | Guterman et al. ....... | 365/185.03 |
| 6,266,276 B1 * | 7/2001 | Odani ..................... | 365/185.18 |
| 6,339,546 B1 | 1/2002 | Katayama et al. | |
| 6,397,364 B1 | 5/2002 | Barkan ....................... | 714/746 |
| 6,456,528 B1 | 9/2002 | Chen ..................... | 365/185.03 |
| 6,467,062 B1 | 10/2002 | Barkan ....................... | 714/764 |
| 6,469,931 B1 | 10/2002 | Ban et al. ............... | 365/185.08 |
| 6,522,580 B2 | 2/2003 | Chen et al. ............. | 365/185.02 |
| 6,674,385 B2 | 1/2004 | Micheloni et al. ........... | 341/155 |
| 6,751,766 B2 | 6/2004 | Guterman et al. ........... | 714/736 |
| 6,785,164 B2 | 8/2004 | Gonzalez et al. ........ | 365/185.21 |
| 6,873,549 B2 | 3/2005 | Khalid et al. .......... | 365/185.03 |

(Continued)

FOREIGN PATENT DOCUMENTS

EP    0 802 540 A    10/1997

OTHER PUBLICATIONS

Bernard Sklar, "Fundamentals of Turbo Codes," Prentice Hall, Mar. 15, 2002, 30 pages.

(Continued)

*Primary Examiner*—Hoai V Ho
(74) *Attorney, Agent, or Firm*—Weaver Austin Villeneuve Sampson LLP

(57) ABSTRACT

Data is read from a nonvolatile memory array using one or more read voltages that are adjusted during memory life. Programming target voltages and read voltages may be adjusted together over memory life to map memory states to an increasingly wide threshold window. Individual memory states are mapped to sub-ranges that are made wider, reducing errors.

13 Claims, 6 Drawing Sheets

U.S. PATENT DOCUMENTS

| | | | |
|---|---|---|---|
| 6,894,926 B2 | 5/2005 | Guterman et al. | 365/185.03 |
| 6,925,007 B2 | 8/2005 | Harari et al. | 365/185.15 |
| 6,941,412 B2 | 9/2005 | Gongwer et al. | 711/103 |
| 6,952,365 B2 | 10/2005 | Gonzalez et al. | 365/185.03 |
| 6,977,844 B2 | 12/2005 | Guterman et al. | 365/185.18 |
| 6,983,428 B2 | 1/2006 | Cernea | 716/1 |
| 7,012,835 B2 * | 3/2006 | Gonzalez et al. | 365/185.11 |
| 7,035,146 B2 | 4/2006 | Hemink et al. | 365/185.22 |
| 7,088,621 B2 | 8/2006 | Guterman et al. | 365/185.18 |
| 7,092,290 B2 | 8/2006 | Hemink | 365/185.18 |
| 2005/0204212 A1 | 9/2005 | Noguchi et al. | 714/710 |
| 2005/0213393 A1 | 9/2005 | Lasser | 365/185.33 |
| 2006/0101193 A1 | 5/2006 | Murin | 711/103 |
| 2007/0076487 A1 * | 4/2007 | Takeuchi et al. | 365/185.22 |
| 2007/0150790 A1 | 6/2007 | Gross et al. | 714/763 |
| 2007/0150791 A1 | 6/2007 | Gross et al. | 714/763 |
| 2007/0208905 A1 * | 9/2007 | Litsyn et al. | 711/103 |
| 2007/0266295 A1 | 11/2007 | Conley | 714/763 |
| 2007/0266296 A1 | 11/2007 | Conley | 714/763 |
| 2008/0082897 A1 | 4/2008 | Brandman et al. | 714/763 |
| 2008/0092014 A1 | 4/2008 | Brandman et al. | 714/794 |
| 2008/0092015 A1 | 4/2008 | Brandman et al. | 714/794 |
| 2008/0092026 A1 | 4/2008 | Brandman et al. | 714/794 |
| 2008/0109702 A1 | 5/2008 | Brandman | 714/752 |
| 2008/0109703 A1 | 5/2008 | Brandman | 714/763 |
| 2008/0123419 A1 | 5/2008 | Brandman et al. | 714/760 |

OTHER PUBLICATIONS

R.Y.S. Tee et al., "Generalized Low-Density Parity-Check Coding Aided Multilevel Codes," IEEE, 2006, 5 pages.

'Noisy Channel Coding Theorem' from Wikipedia, the free encyclopedia (Redirected from Shannon's theorem) [online] (author unknown); Retrieved from the Internet on Mar. 23, 2006, 3 pages.

'Convolutional Code', Wikipedia, the free encyclopedia [online] (author unknown); retrieved from the Internet on Mar. 23, 2006, 2 pages.

Turbo Code, Wikipedia,the free encyclopedia [online] (author unknown), retrieved from the Internet on Mar. 23, 2006, 4 pages.

Fleming, Chip, 'A Tutorial on Convolutional Coding with Viterbi Decoding', dated Jan. 31, 2003, [online] retrieved from the Internet Mar. 23, 2006, 5 pages.

'Error Correcting Codes', [online] (author unknown) retrieved from the Internet on Mar. 18, 2005, 2 pages; redirected from Univ. of Edinburgh School of Informatics.

PCT Invitation to Pay Additional Fees mailed Sep. 4, 2008 in International Application No. PCT/US2007/082831.

PCT International Search Report and Written Opinion mailed Nov. 13, 2008 in International Application No. PCT/US2007/082831.

* cited by examiner

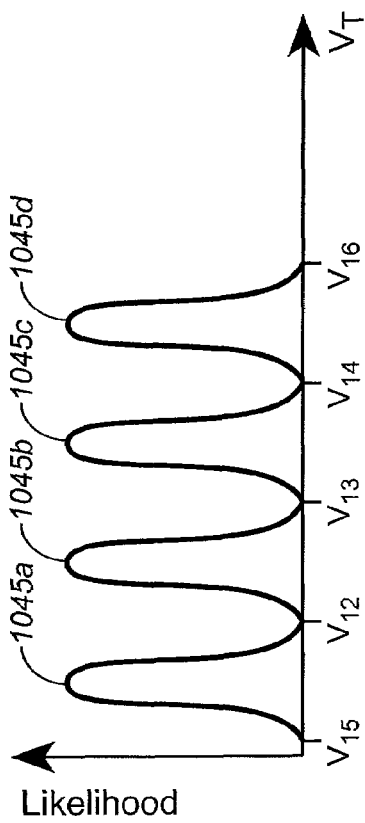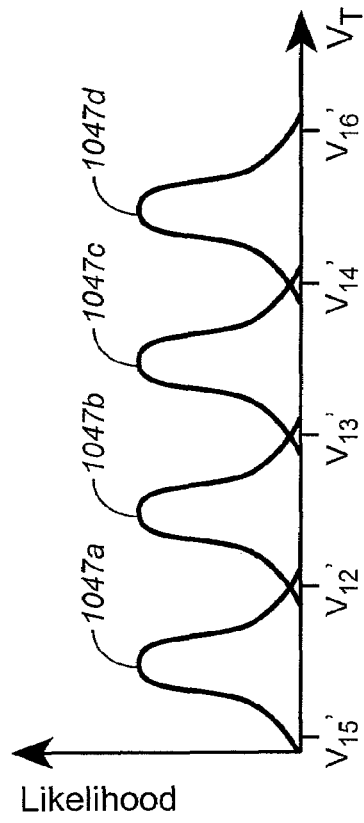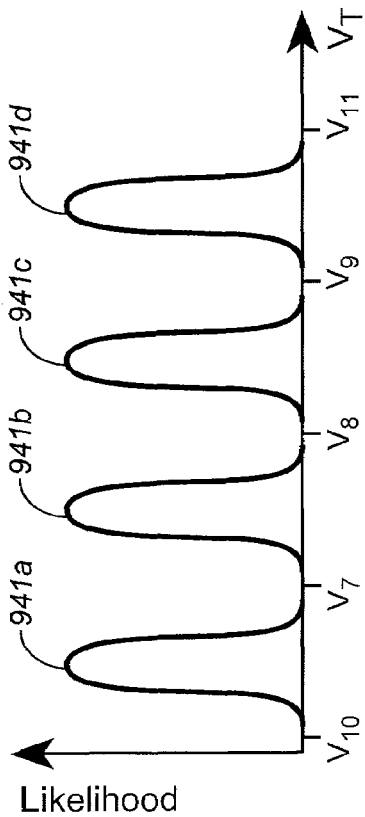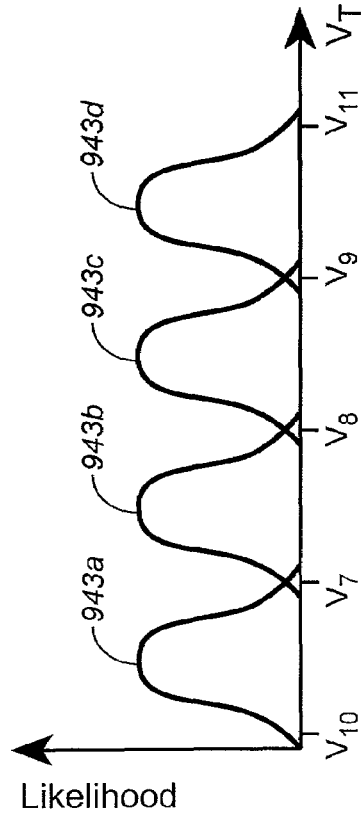

NONVOLATILE MEMORY WITH VARIABLE READ THRESHOLD

CROSS-REFERENCE TO RELATED APPLICATIONS

This application is related to U.S. Patent Applications entitled "Methods of Varying Read Threshold Voltage in Nonvolatile Memory" by Yigal Brandman and Kevin M. Conley, filed Nov. 3, 2006, application Ser. No. 11/556,615, "Methods of Modulating Error Correction Coding" by Yigal Brandman, filed Nov. 3, 2006, application Ser. No. 11/556,632 and "Nonvolatile Memory With Modulated Error Correction Coding" by Yigal Brandman, filed Nov. 3, 2006, application Ser. No. 11/556,636, all of which are filed herewith. These applications are incorporated in their entirety by reference as if fully set forth herein.

This application is also related to U.S. patent application Ser. No. 11/536,286, filed Sep. 28, 2006 entitled "Methods of Soft-Input Soft-Output Decoding for Nonvolatile Memory," U.S. patent application Ser. No. 11/536,327, filed Sep. 28, 2006 entitled "Soft-Input Soft-Output Decoder for Nonvolatile Memory, " U.S. patent application Ser. No. 11/536,347, filed Sep. 28, 2006 entitled "Methods of Adapting Operation of Nonvolatile Memory," and U.S. patent application Ser. No. 11/536,372 filed Sep. 28, 2006, entitled "Nonvolatile Memory with Adaptive Operation." These applications are incorporated in their entirety by reference as if fully set forth herein.

BACKGROUND OF THE INVENTION

This invention relates to nonvolatile memory systems and to methods of operating nonvolatile memory systems.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Data stored in a nonvolatile memory system may contain erroneous bits when data is read. Traditional ways to reconstruct corrupted data include the application of Error Correction Codes (ECCs). Simple Error Correction Codes encode data by storing additional parity bits, which set the parity of groups of bits to a required logical value, when the data is written into the memory system. If during storage the data is erroneous, the parity of groups of bits may change. Upon reading the data from the memory system, the parity of the group of the bits is computed once again by the ECC. Because of the data corruption the computed parity may not match the required parity condition, and the ECC may detect the corruption.

ECCs can have at least two functions: error detection and error correction. Capability for each of these functions is typically measured in the number of bits that can be detected as erroneous and subsequently corrected. Detection capability can be the same or greater than the correction capability. A typical ECC can detect a higher number of error bits than it can correct. A collection of data bits and parity bits is sometimes called a word. An early example is the (7,4) Hamming code, which has the capability of detecting up to two errors per word (seven bits in this example) and has the capability of correcting one error in the seven-bit word.

More sophisticated ECCs can correct more than a single error per word, but it becomes computationally increasingly complex to reconstruct the data. Common practice is to recover the data with some acceptably small likelihood of incorrect recovery. However with increasing number of errors the probability of reliable data recovery also decreases rapidly or the associated costs in additional hardware and/or performance become prohibitively high.

In semiconductor memory devices, including EEPROM systems, data can be represented by the threshold voltages of transistors. Typically, different digital data storage values correspond to different voltage ranges. If, for some reason, during the read operation the voltage levels shift from their preferred ranges, an error occurs. The error may be detected by the ECC and in some cases these errors may be corrected.

SUMMARY OF INVENTION

In a flash memory array, at a first time, a plurality of memory states are mapped to a first threshold window, where individual ones of the plurality of memory cells are mapped to sub-ranges of the first threshold window, at a subsequent second time, the plurality of memory states are mapped to a second threshold window, where individual ones of the plurality of memory states are mapped to sub-ranges of the second threshold window, the second threshold window being wider than the first threshold window.

A method of reading data from a flash memory array includes reading first data bits from the memory by comparing threshold voltages of a plurality of memory cells to first predetermined voltages, decoding the first data bits in an ECC decoder, and subsequently reading second data bits from the plurality of memory cells by comparing threshold voltages of memory cells to second predetermined voltages, the second predetermined voltages determined from the decoding of the first data bits in the ECC decoder.

A flash memory system comprises a flash memory array that includes a plurality of cells programmed to a plurality of programmed states; and a reading circuit connected to the memory array, the reading circuit comparing a memory cell threshold voltage to a first plurality of predetermined voltages do distinguish the plurality of programmed states in a first mode and comparing the memory cell threshold voltage to a second plurality of predetermined voltages to distinguish the plurality of programmed states in a second mode, the highest one of the second plurality of predetermined voltages being higher than the highest one of the first plurality of predetermined voltages.

A flash memory system comprises a memory array that includes a plurality of nonvolatile memory cells; an ECC decoder that decodes data from the memory array; a reading circuit connected to the memory array, the reading circuit comparing a threshold voltage of a memory cell to at least one predetermined voltage to determine a programmed state of the memory cell; and an adjustment circuit that increases or decreases the at least one predetermined voltage in response to information from the ECC decoder.

BRIEF DESCRIPTION OF THE DRAWINGS

FIG. 9A shows likelihood functions of four memory states and discrimination voltages resolving those states at an early stage of memory life.

FIG. 9B shows likelihood functions of the four memory states of FIG. 9A at a later stage of memory life with the same discrimination voltages.

FIG. 10A shows likelihood functions of four memory states at an early stage of memory life according to another embodiment where discrimination voltages are more closely spaced than in the previous example.

FIG. 10B shows likelihood functions of the four memory states of FIG. 10A at a later stage of memory life with adjusted discrimination voltages that are more widely spaced than discrimination voltages of FIG. 10A.

DETAILED DESCRIPTION OF ILLUSTRATED EMBODIMENTS

Figure 1:
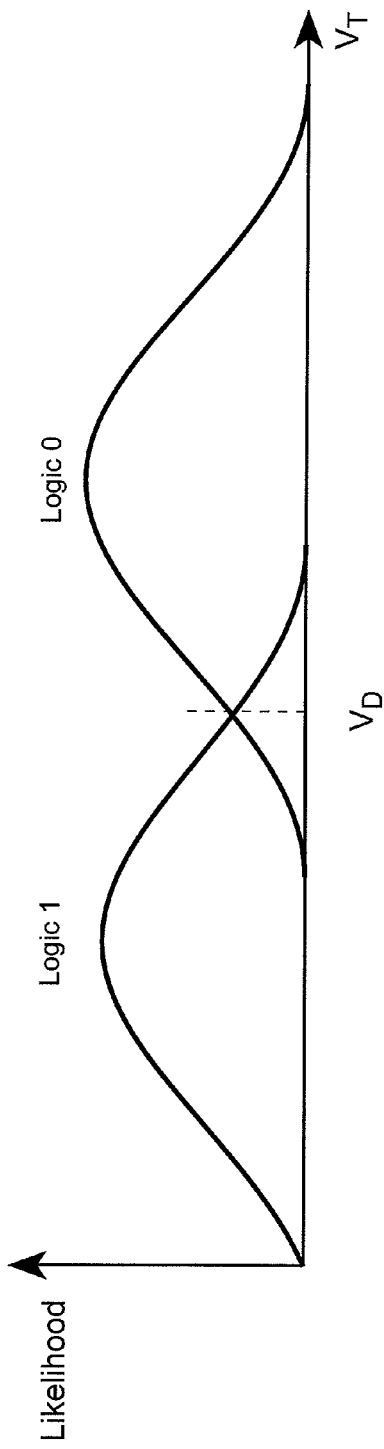
FIG. 1 shows likelihood functions of threshold voltages of cells programmed to a logic 1 state and a logic 0 state in a nonvolatile memory, including a voltage $V_D$ used to discriminate logic 1 and logic 0 states.

In many nonvolatile memories, data read from a memory array may have errors. That is, individual bits of input data that are programmed to a memory array may later be read as being in a different logical value. FIG. 1 shows the relationship between a physical parameter indicating a memory cell state (threshold voltage, $V_T$) and the logical values to which the memory cell may be programmed. In this example, only two states are stored in the cell. Thus, the cell stores one bit of data. Cells programmed to the logic 0 state generally have a higher threshold voltage than cells in the logic 1 (unprogrammed) state. In an alternative scheme, the logic 1 state is the unprogrammed state of the memory cell. The vertical axis of FIG. 1 indicates the likelihood of reading a cell at any particular threshold voltage based upon expected threshold voltage distribution. A first likelihood function is shown for cells programmed to logic 1 and a second for cells programmed to logic 0. However, these functions have some degree of overlap between them. A discrimination voltage $V_D$ is used in reading such cells. Cells having a threshold voltage below $V_D$ are considered to be in state 1, while those having a threshold voltage above $V_D$ are considered to be in state 0. As FIG. 1 shows, this may not always be correct. Because of the overlap between functions, there is a non-zero likelihood that a memory cell programmed to a logic 1 state will be read as having a threshold voltage greater than $V_D$ and so will be read as being in a logic 0 state. Similarly, there is a non-zero likelihood that a memory cell programmed to a logic 0 state will be read as having a logic 1 state.

Overlap between functions occurs for a number of reasons including physical defects in the memory array and disturbance caused to programmed cells by later programming or reading operations in the memory array. Overlap may also occur due to a general lack of ability to keep a large number of cells within a very tight threshold voltage range. Certain programming techniques may allow functions of threshold voltages to be narrowed (have smaller standard deviations). However, such programming may take more time. In some memory systems, more than one bit is stored in a memory cell. In general, it is desirable to store as many bits as possible in a memory cell. In order to efficiently use the available threshold voltage range, functions for adjacent states may be such that they significantly overlap.

Nonvolatile memory systems commonly employ ECC methods to overcome errors that occur in data that is read from a memory array. Such methods generally calculate some additional ECC bits from input data to be stored in a memory array according to an encoding system. Other ECC schemes may map input data to output data in a more complex way. The ECC bits are generally stored along with the input data but may be stored separately. The input data and ECC bits are later read from the nonvolatile memory array together and a decoder uses both the data and ECC bits to check if any errors are present. In some cases, such ECC bits may also be used to identify a bit that is in error. The erroneous bit is then corrected by changing its state (changed from a "0" to a "1" or from a "1" to a "0"). Appending ECC bits to data bits is not the only way to encode data before storing it in a nonvolatile memory. For example, data bits may be encoded according to a scheme that provides the following transformations: 00 to 1111, 01 to 1100, 10 to 0011 and 11 to 0000.

Figure 2:
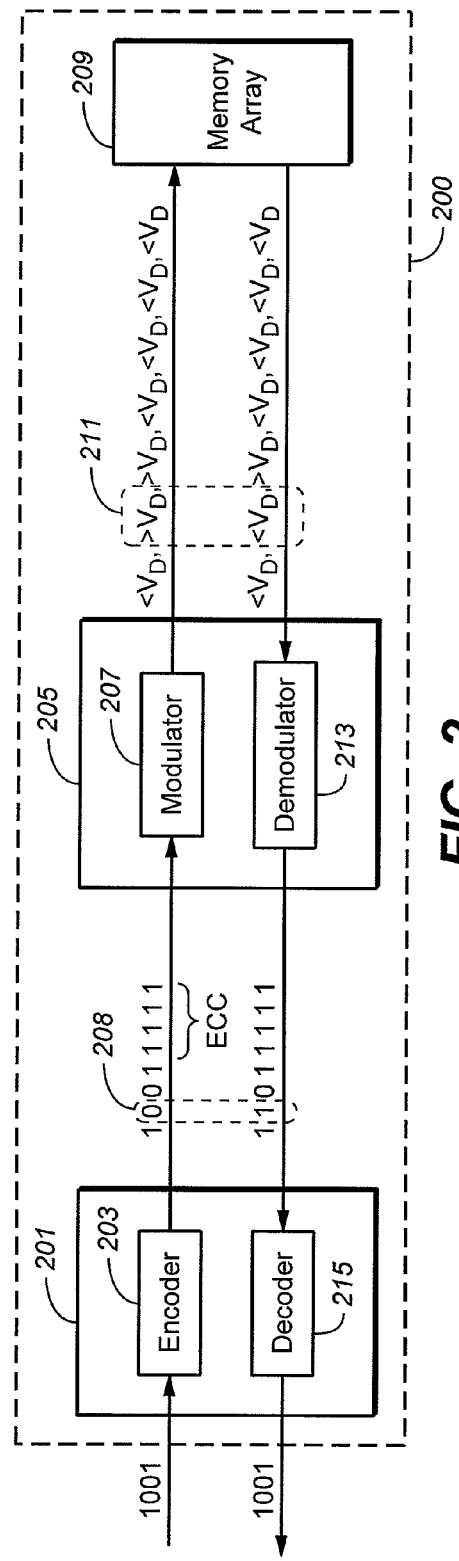
FIG. 2 shows components of a memory system including a memory array, modulator/demodulator circuits and encoder/decoder circuits.

FIG. 2 shows an example of input data being stored in a memory system 200. Input data is first received by an ECC unit 201 that includes an encoder 203. The input data may be host data to be stored in memory system 200 or may be data generated by a memory controller. The example of FIG. 2 shows four input data bits 1001. Encoder 203 then calculates ECC bits (1111) from the input data bits using an encoding scheme. One example of an encoding scheme is to generate ECC bits that are parity bits for selected groups of data bits.

Both the input data bits and the ECC bits are then sent to a modulation/demodulation unit 205 that includes a modulator 207. Modulator 207 converts the digital data sent by ECC unit 201 to a form in which it is written in a memory array 209. In one scheme, the digital data is converted to a plurality of threshold voltage values in a plurality of memory cells. Thus, various circuits used to convert digital data to a stored threshold voltage in a memory cell may be considered to form a modulator. In the example of FIG. 2, each memory cell may hold one bit of data. Thus, each memory cell may have a threshold voltage in one of two ranges, one signifying a logic "1" state and the other signifying a logic "0" state as shown in FIG. 1. The memory cells storing a logic "1" state have a threshold voltage that is less than $V_D$ ($<V_D$) while the memory cells storing a logic "0" state have a threshold voltage that is greater than $V_D$ ($>V_D$). Cells may be programmed and verified to a nominal threshold voltage higher than $V_D$ to ensure that, at least initially, there is some preferred separation between cells programmed to the two logic states.

Data may be stored in memory array 209 for some period of time. During this time, various events may occur to cause threshold voltages of memory cells to change. In particular, operations involving programming and reading may require voltages to be applied to word lines and bit lines in a manner that affects other previously programmed cells. Such disturbs are particularly common where dimensions of devices are reduced so that the interaction between adjacent cells is significant. Charge may also be lost over long periods of time. Such data retention failures can also cause data to change when read. As a result of such changes, data bits may be read out having different states than the data bits originally programmed. In the example of FIG. 2, one input data bit 211 is read as having a threshold value less than $V_D$ ($<V_D$) when it was originally written having a threshold value greater than $V_D$ ($>V_D$).

The threshold voltages of memory cells are converted to bits of data by a demodulator 213 in modulation/demodulation unit 205. This is the reverse of the process performed by the modulator. Demodulator 213 may include sense amplifiers that read a voltage or current from a memory cell in memory array 209 and derive the state of the cell from the reading. In the example of FIG. 2, a memory cell having a threshold voltage less than $V_D$ ($<V_D$) gives a demodulated output of "1" and a memory cell having a threshold voltage that is greater than $V_D$ ($>V_D$) gives a demodulated output of "0." This gives the output sequence 11011111 shown. The second bit 208 of this sequence is in error as a result of being stored in the memory array 209.

The output of demodulator 213 is sent to a decoder 215 in ECC unit 201. Decoder 215 determines from data bits and ECC bits if there are any errors. If a small number of errors is present that is within the correction capability of the code, the errors are corrected. If large numbers of errors are present, they may be identified but not corrected if they are within the detection capability of the code. If the number of errors exceeds the detection capability of the code, the errors may not be detected, or may result in an erroneous correction. In the example of FIG. 2, the error in the second bit is detected and is corrected. This provides an output (1001) from decoder 215 that is identical to the input sequence. The decoding of memory system 200 is considered to be hard-input hard-output decoding because decoder 215 receives only data bits representing input data bits and ECC bits, and decoder 215 outputs a corrected sequence of data bits corresponding to input data bits (or fails to give an output if the number of errors is too high).

Figure 3:
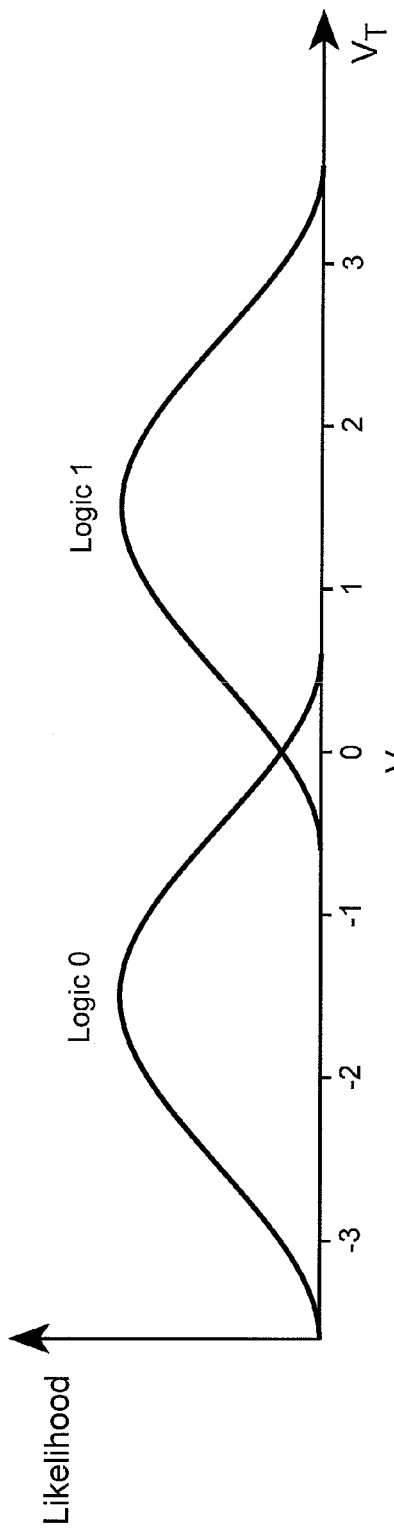
FIG. 3 shows likelihood function of read threshold voltages of cells programmed to a logic 1 state and a logic 0 state, showing threshold voltage values.
Figure 4:
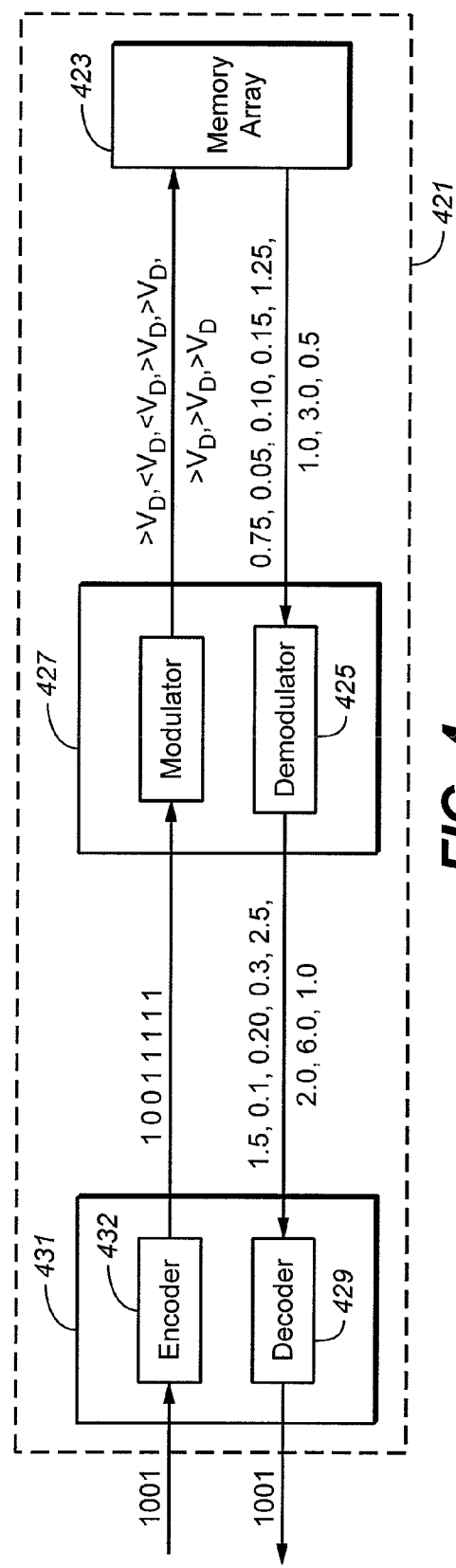
FIG. 4 shows components of a memory system including a memory array, modulator/demodulator circuits and encoder/decoder circuits, a demodulator providing likelihood values to a decoder.

An alternative memory system to memory system 200 is shown in FIGS. 3 and 4. FIG. 3 shows similar functions to those of FIG. 1 with $V_D$=0 and with threshold voltages below $V_D$ representing logic 0 and voltages above $V_D$ representing logic 1. Instead of showing a single voltage $V_D$ dividing threshold voltages into two different ranges, here the threshold voltages are indicated by actual voltage numbers. The function corresponding to logic "1" is centered above 0 volts and the function corresponding to logic "0" is centered below 0 volts.

FIG. 4 shows a memory system 421 using a data storage process that is similar to that of memory system 200 (using the same input data bits and ECC bits) with a different read process. In particular, instead of simply determining whether a threshold voltage is above or below a particular value, memory system 421 reads threshold voltages as shown in FIG. 3. It will be understood that actual threshold voltage is not necessarily read. Other means of cell operation may be used to store and retrieve data (e.g. current sensing). Voltage sensing is merely used as an example. Generally, threshold voltage refers to a gate voltage at which a transistor turns on. FIG. 4 shows a read occurring that provides more detailed information than the previous example. This may be considered a read with a higher resolution than that of FIG. 2 (and a resolution that resolves more states than are used for programming). As in the previous example, errors occur in the read data. Here, the readings corresponding to the second and third bits are in error. The second and third bits were logic "0" and were stored by programming a cell to have a threshold voltage less than $V_D$ but the cells are read as having threshold voltages of 0.05 volts and 0.10 volts which is higher than $V_D$ ($V_D$=0 volts).

The raw voltages read from memory array 423 of FIG. 4 by a series of read operations are sent to a demodulator 425 in a modulation/demodulation unit 427. The raw voltages have a finite resolution dictated by the resolution of the Analog-to-Digital conversion. Here, raw data is converted into likelihood data. In particular, each cell reading is converted into a likelihood that the corresponding bit is a one or a zero. The series of readings from the memory array (0.75, 0.05, 0.10, 0.15, 1.25, 1.0, 3.0, and 0.5 volts) can indicate not only the state of the cell, but can also be used to provide a degree of certainty as to that state. This may be expressed as a likelihood that a memory cell was programmed with a particular bit. Thus, readings that are close to 0 volts may give low likelihood values, while readings that are farther from 0 volts give higher likelihood values. The likelihood values shown are log likelihood ratios (explained in detail below). This provides negative numbers for cells in a logic 0 state and positive numbers for cells in a logic 1 state, with the magnitude of the number indicating the likelihood that the state is correctly identified. The second and third likelihood values (0.1, 0.2) indicate logic "1". The second and third values indicate likelihoods that are quite low.

Likelihood values are sent to a decoder 429 in an ECC unit 431 (in some cases, obtaining likelihood values from raw values may be considered as being performed in the decoder). ECC unit 431 also includes encoder 432. The decoder 429 performs decoding operations on likelihood values. Such a decoder may be considered a soft-input decoder. In general, soft-input refers to an input that includes some quality information related to data that are to be decoded. The additional information provided as a soft-input generally allows a decoder to obtain better results. A decoder may perform decoding calculations using a soft-input to provide calculated likelihood values as an output. This is considered a soft-output and such a decoder is considered a Soft-Input Soft-Output (SISO) decoder. This output can then be used again as input to the SISO decoder to iterate the decoding and improve results. A SISO decoder may form part of a larger decoder that provides a hard output to another unit. SISO decoders generally provide good performance and in some cases may provide better performance than is possible with hard-input hard-output decoding. In particular, for the same amount of overhead (number of ECC bits) a SISO decoder may provide greater error correction capability. In order to efficiently use a SISO decoder, a suitable encoding/decoding scheme may be implemented and demodulation is adapted to efficiently obtain a soft-input without excessive complexity and without requiring excessive time for reading data from the memory array.

In one embodiment, a soft-input for a SISO decoder is provided by reading data in a nonvolatile memory array with a resolution that resolves a larger number of states than were used in programming the memory. Thus, data may be written by programming a memory cell to one of two threshold voltage ranges and subsequently read by resolving three or more threshold voltage ranges. Typically, the number of threshold voltage ranges used in reading will be some multiple of the number of threshold voltage ranges used in programming (for example, twice as many). However, this is not always the case.

An ECC unit may be formed as a dedicated circuit or this function may be performed by firmware in a controller. Typically, a controller is an Application Specific Integrated Circuit (ASIC) that has circuits designed for specific functions such as ECC and also has firmware to manage controller operations. Thus, an encoder/decoder may be formed by a combination of hardware and firmware in the memory controller. An encoder/decoder (ECC unit) may alternatively be located on the memory chip. The modulation/demodulation unit may be on a memory chip, on a controller chip, on a separate chip or some combination. Generally, a modulation/demodulation unit will include at least some components on the memory chip (such as peripheral circuits connected to a memory array). While FIG. 4 indicates threshold voltages being read to a high resolution (an analog read), the degree of resolution chosen may depend on a number of factors including the type of nonvolatile memory used.

Figure 5:
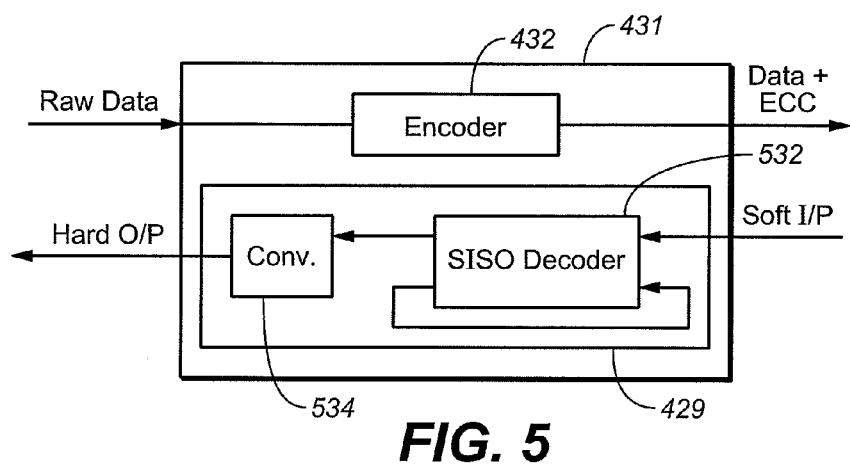
FIG. 5 shows an ECC unit having a Soft-Input Soft-Output (SISO) decoder.

FIG. 5 shows a more detailed view of ECC unit 431, particularly decoder 429. Decoder 429 includes a SISO decoder 532 and a soft-hard converter 534. SISO decoders generally accept raw likelihood data and perform ECC calculations on the raw likelihood data to provide calculated likelihood data. The calculated likelihood data may be considered a soft-output. In many cases, such a soft-output is then provided as an input to the SISO decoder so that a second decoding iteration is performed. A SISO decoder may perform successive iterations until at least one predetermined condition is achieved. For example, a predetermined condition may be that all bits have a likelihood that is greater than a certain minimum value. A predetermined condition could also be an aggregate of likelihood values such as a mean likelihood value. A predetermined condition may be convergence of results from one iteration to the next (i.e. keep iterating until there is little improvement from additional iterations). A pre-determined condition may be that a predetermined number of iterations are completed. Combinations of these conditions may also be used. Decoding is performed using an encoded pattern in the data that is the result of encoding performed by encoder 432 on the data before it was stored. Encoder 432 and decoder 429 are both considered parts of ECC unit 431.

Efficient decoding depends on having a suitable encoding/decoding scheme. Various schemes are known for encoding data in a manner that is suitable for subsequent decoding in a SISO decoder such as SISO decoder 532. Encoding/decoding schemes include, but are not limited to, turbo codes, product codes, BCH codes, Reed-Solomon codes, convolutional codes (see U.S. patent application Ser. Nos. 11/383,401 and 11/383,405), Hamming codes, and Low Density Parity Check (LDPC) codes. A detailed description of LDPC codes and turbo codes and how they may be used with SISO decoding is provided in U.S. patent application Ser. No. 11/536,286, entitled: "Soft-input soft-output decoder for nonvolatile memory" and U.S. patent application Ser. No. 11/536,327, entitled: "Methods of soft-input soft-output decoding for nonvolatile memory," both filed on Sep. 28, 2006.

In some cases statistics may be collected regarding correction carried out by an ECC decoder. Such statistics may be used to make adjustments in operating parameters of a memory array. U.S. patent applications Ser. Nos. 11/536,347 and 11/536,372 filed on Sep. 28, 2006 describe nonvolatile memory systems with operating parameters that are adjusted and methods for adjusting such parameters.

Figure 6:
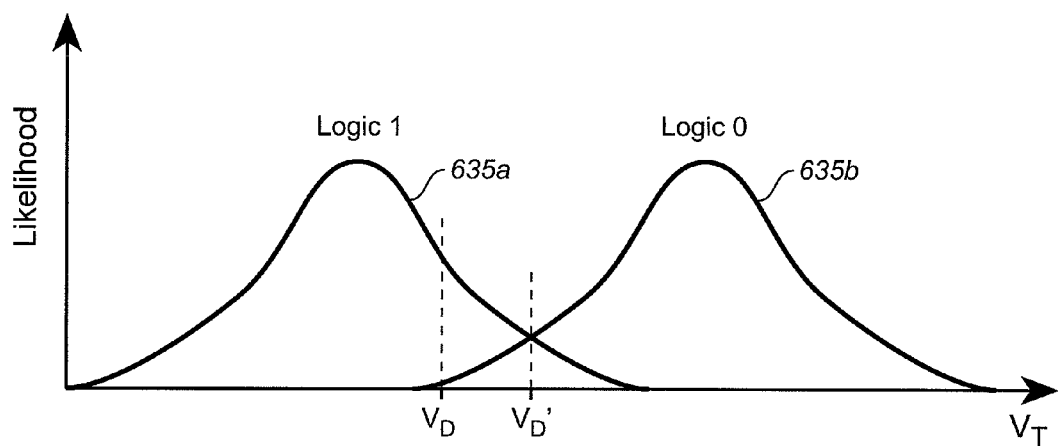
FIG. 6 shows likelihood functions of a logic 1 state and a logic 0 state of a memory cell with two exemplary discrimination voltages.

One example of an operating parameter of a nonvolatile memory that may be adjusted is a discrimination voltage between programmed memory states. FIG. 6 shows likelihood functions 635a, 635b for read threshold voltages of cells programmed to logic 1 and programmed to logic 0. A first discrimination voltage $V_D$ is shown at a location that provides a large number of errors because any cell having a threshold voltage higher than $V_D$ is considered to be programmed to logic 0, even though as FIG. 6 shows, there is a significant likelihood that such a cell was in fact programmed to logic 1. Using $V_D$ as a discrimination voltage means that a significant number of cells are read as being in logic 0 though they were programmed to logic 1. Such data bits are generally corrected by ECC. There is a very low likelihood that a cell programmed to logic 0 will be read as having logic 1, so ECC correction of such bits is rare. Thus, an ECC decoder in this case would perform more 0-to-1 corrections than 1-to-0 corrections.

A second discrimination voltage $V_D'$ is shown at a threshold voltage where the logic 1 function and the logic 0 function intersect. Thus, where a cell has a threshold voltage of $V_D'$ there is an equal likelihood that the cell was programmed to logic 1 and to logic 0. This is the optimum location for a discrimination voltage. Even with the discrimination voltage at $V_D'$ there is some likelihood that a cell's threshold voltage will indicate the wrong logic state. However, the likelihood is low and the number of cells programmed to logic 0 that are subsequently read as having logic 1 is equal to the number of cells programmed to logic 1 that are subsequently read as having logic 0. When a discrimination voltage is not at its optimum value (e.g. at $V_D$), it may be desirable to adjust the discrimination voltage to bring it to its optimum (e.g. $V_D'$), or at least bring it closer to its optimum value. One way to detect that a discrimination voltage is not at its optimum value is from correction made by an ECC decoder to bits corresponding to memory states on either side of the discrimination voltage.

An ECC decoding can generally indicate whether a discrimination voltage is located at an optimum location from the number of corrections made between logic states on either side of the discrimination. If a discrimination voltage is not at its optimum location, the ECC decoding may indicate (from the number of corrections from states on either side of the discrimination voltage) the direction in which the discrimination voltage should be moved. ECC decoding may also indicate how much a discrimination voltage should be moved from the respective numbers of corrections from the higher state (logic 0 in this example) to the lower state (logic 1 in this example) compared to corrections from the lower state to the higher state. Suitable circuits may be used to determine, from ECC corrections of data read using initial discrimination voltages, whether discrimination voltages should be adjusted. If such adjustments are to be made then the circuits may indicate in which direction they should be adjusted and may also indicate by how much they should be adjusted.

Figure 7A:
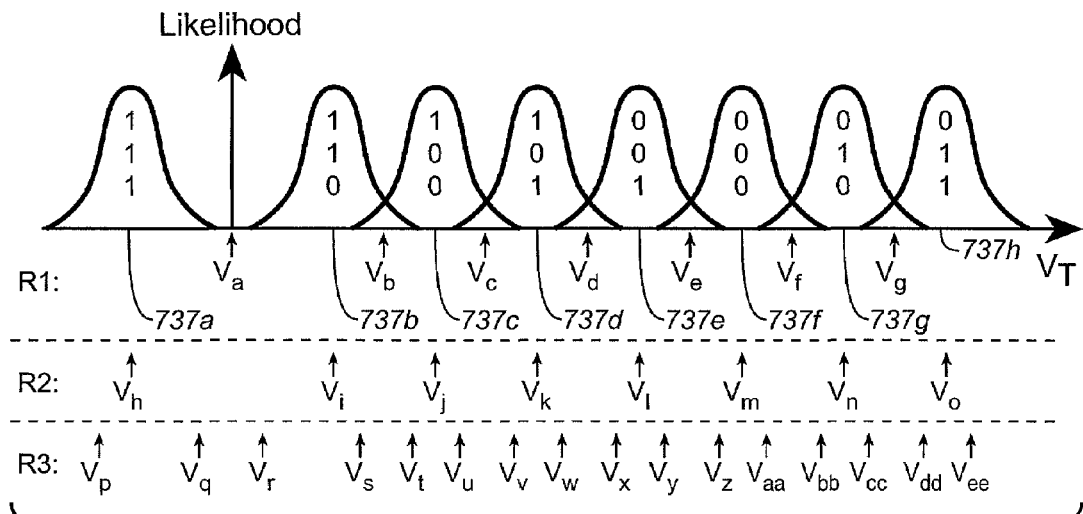
FIG. 7A shows likelihood functions of eight memory states, representing three bits of data, with three read passes providing discrimination between memory states and additional resolution within memory states.

While FIG. 6 only shows two programmed states representing one bit of stored data, in some configurations memory cells may be programmed to three or more states representing more than one bit of stored data. FIG. 7A shows an example where a threshold voltage range of a memory cell (threshold window) is divided into eight sub-ranges that individually represent programmed states. Three bits of data are stored in such a cell. The cell is read as being in one of the eight sub-ranges 737*a-h* during a first read pass (R1) that compares the threshold voltage of the cell with seven discrimination voltages Va-Vg. The discrimination voltages Va-Vg are located where it is expected that likelihood functions for neighboring states will intersect. In addition to comparing the threshold voltage of the cell with the discrimination voltages Va-Vg, the threshold voltage is also compared to intermediate voltages Vh-Vo in a second read pass (R2). The intermediate voltages Vh-Vo are between discrimination voltages Va-Vg and provide further resolution within each sub-range 737*a*-737*h* of the first read pass R1. A third read pass (R3) is performed using additional intermediate voltages Vp-Vee that further resolve within sub-ranges 737*a-h*. In some cases, yet more read passes may be performed to achieve a high resolution. Results of two or more read passes may be used to provide a threshold voltage of a memory cell with a high resolution. This may be considered a form of analog-to-digital conversion. Results of each read may be latched in registers that are formed as peripheral circuits to the memory array. When all necessary reads have been performed, the contents of the registers are used to provide a threshold voltage value (or equivalent) that is sent to other circuits, such as an ECC decoder. Alternatively, an output from each read may be sent from a memory chip to circuits elsewhere (e.g. in a controller ASIC), where analog-to-digital conversion is performed. Sending such data may be done in parallel with further reads for efficiency.

In some memory systems, other adjustments may be made in response to ECC corrections. For example, where a lookup table is used to correlate threshold voltages with probability values associated with particular bits, the lookup table may be adjusted to balance the number of corrections from one state to another. Thus, the correlation of threshold voltage and probability is dynamically updated according to observations of ECC correction.

As with the two state memory cell of FIG. 6, discrimination voltages in the example of FIG. 7A may be adjusted to balance the corrections between adjacent states. For example, a discrimination voltage Vc may be adjusted so that the number of corrections from the 100 state to the 101 state and the number of corrections from the 101 state to the 100 state are made more equal. In general, where the discrimination voltages are adjusted, intermediate voltages of the second read pass R2 and third read pass R3 are also adjusted. Generally, such intermediate voltages are arranged in a pattern to obtain useful information about the threshold voltage of the cell. Such information may be used to provide probability values regarding the state of the memory cell. Performing separate read passes such as R1, R2 and R3 is not always necessary and in some cases a single sequence of voltage comparisons is performed as a single read including discrimination voltages and intermediate voltages. In another example, a binary search may be performed.

Because there are more than two memory states in the example of FIG. 7A, correction by ECC, and analysis of such correction, may be more complex. It is not generally sufficient to simply monitor the number of corrections of bits from 1-to-0 and from 0-to-1. With three bits per cell, more 1-to-0 corrections than 0-to-1 corrections may mean a discrimination voltage should be increased in some cases or should be decreased in other cases depending on the mapping of bits to memory states. For example, to adjust the discrimination voltage between the 100 state and 101 state, only correction of the least significant bit needs to be considered because the other bits are the same for both of these states. A higher number of corrections from 0-to-1 than from 1-to-0 (for least significant bits in cells having 1 and 0 as higher bits) would indicate that threshold voltage Vc is too high and should be lowered. A statistical unit may track corrections with respect to the memory states used to represent a corrected bit and uncorrected bit so that appropriate adjustment may be made.

Figure 7B:
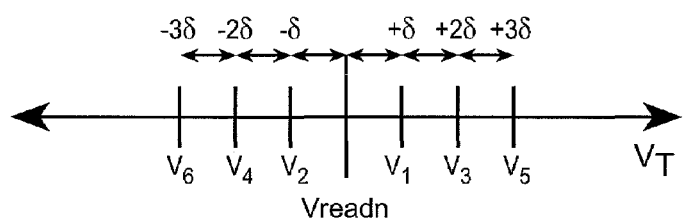
FIG. 7B shows an exemplary arrangement of read voltages including a discrimination voltage and additional read voltages at increments on either side of the discrimination voltage.

FIG. 7B shows one example of a pattern of intermediate read voltages V1-V6 arranged around a discrimination voltage Vreadn. In particular, FIG. 7B shows intermediate voltages V1 and V2 at a voltage difference δ on either side of Vreadn, intermediate voltages V3 and V4 at a voltage difference 2δ on either side of Vreadn and intermediate voltages V5 and V6 at a voltage difference of 3δ on either side of Vreadn. The threshold voltage of a cell may be compared with Vreadn and V1-V6 in reads of increasing resolution as in FIG. 7A, or may be compared in order of increasing or decreasing voltage or in any other convenient order. Generally, where Vreadn is adjusted to balance ECC corrections between adjacent states, intermediate voltages V1-V6 will be adjusted accordingly to maintain the same offsets from Vreadn.

Figure 8:
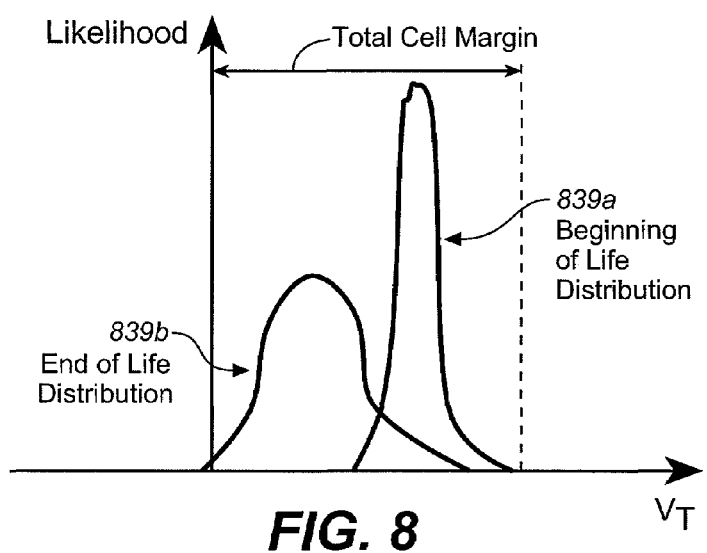
FIG. 8 shows how a likelihood function for a memory cell state may change as the memory is used, the likelihood distribution becoming wider with use.

Adjustment of discrimination voltages may be made in either direction according to corrections made by an ECC decoder. Thus, a threshold voltage range associated with a particular programmed state may be widened or narrowed and may be shifted up in voltage or down in voltage. In general, in flash memory the likelihood function for a particular programmed state becomes wider with memory use. FIG. 8 shows two likelihood functions 839*a*-839*b* for the same cell, function 839*a* showing the beginning of life distribution of likelihood as a function of threshold voltage $V_T$, and function 839*b* showing the end of life distribution of likelihood as a function of threshold voltage $V_T$. As is shown, the beginning of life distribution 839*a* is narrower than the end of life distribution 839*b*. It will be understood that real data from memory cells shows similar distributions to those of FIG. 8 with the y-axis indicating the number of cells read at different threshold voltages. Likelihood is used for the y-axis in the present description.

One way to deal with the widening of likelihood distributions associated with programmed memory states as a memory is used is shown in FIGS. 9A and 9B. FIG. 9A shows four likelihood distributions 941*a-d* associated with four programmed states early in the memory's life. Discrimination voltages V7, V8 and V9 are located between distributions 941*a-d*. FIG. 9A shows no significant overlap between adjacent distributions 941a-d indicating that a large margin is used in this case and the chances of misreading a cell are low.

FIG. 9B shows likelihood distributions 943a-d associated with the same four programmed states of the same cell at a later stage in the memory's life after the cell has undergone a number of memory operations such as reading, programming and erasing. The distributions 943a-d have widened in comparison with distributions 941a-d and show some overlap so that there may be a significant likelihood of misreading the stored data. Discrimination voltages V7-V9 are used to discriminate between memory states as before. Thus, memory states remain mapped to the same threshold window (V10-V11), and individual memory states remain mapped to the same sub-ranges within threshold window V10-V11. Where distributions continue to widen, at some point the number of errors in data read from the memory exceeds the capacity of an ECC decoder and the memory is no longer usable. In this example, discrimination voltages V7-V9 are initially set at levels that provide a larger margin than needed. This uses a threshold window V10 to V11 throughout the memory's life. However, using this wide threshold window may unnecessarily stress the memory because high voltages are needed to program memory cells to high threshold windows such as between V9 and V11.

FIGS. 10A and 10B show an alternative arrangement that uses a smaller threshold window V15-V16 initially and a larger threshold window V15'-V16' later in the life of the memory. Initially, memory cell states are mapped to a narrower threshold window (total threshold voltage range) V15-V16 and subsequently they are mapped to a wider threshold window (total threshold voltage range) V15'-V16'. FIG. 10A shows likelihood functions 1045a-d for four memory states that are closer together than similar memory states 941a-d of FIG. 9A. This is the result of programming to target voltages that are arranged to be closer together. A programming target voltage is the memory cell threshold voltage that a memory cell is verified as achieving during a programming operation (typically, once a memory cell is verified as reaching the target voltage, further programming of the cell is inhibited, while other cells are programmed further). Programming target voltages (in particular the highest programming target voltage) are lower than in FIG. 9A, so programming voltages (e.g. Vprog and Vpass supplied to selected and unselected word lines respectively in NAND memory) may be reduced. Discrimination voltages V12-V14 define narrower threshold voltage sub-ranges for each memory state during reading. Thus, the threshold window V15-V16 to which memory states are mapped is narrower in this example than threshold window V10-V11.

After the memory has been in use for some time, likelihood functions become wider resulting in likelihood functions 1047a-d of FIG. 10B. Thus, if programming target voltages and discrimination voltages remain the same, a high degree of overlap between likelihood functions would occur and a large number of errors would result. To overcome this problem, FIG. 10B shows adjusted discrimination voltages V12'-V14' that are more widely spaced than discrimination voltages V12-V14. Memory states are mapped to a wider threshold window (V15'-V16') in FIG. 10B than the threshold window (V15-V16) to which the same memory states were mapped earlier. Thus, the memory of FIGS. 10A and 10B compensates for widening likelihood distributions for individual memory states by increasing the total threshold voltage range to which memory states are mapped. One advantage of this scheme is that early in the memory's life, lower voltages are used for programming and reading and these lower voltages provide less stress for the memory cells being read and programmed. Such reduced stress may slow wear-out of memory cells and increase product life. Remapping memory states to threshold windows may include adjusting programming target voltages as well as read voltages. Programming target voltages are more widely spaced as the memory system goes through its life.

FIGS. 10A and 10B show discrimination voltages V12-V14 and V12'-V14' used during read operations, though other read voltages may also be used to give a high resolution read that resolves within threshold voltage sub-ranges associated with memory states as described above. Generally programming target voltages and read voltages may all be adjusted together according to a predetermined scheme or may be individually adjusted in responsive manner, for example in response to information from an ECC decoder. Adjustment may occur in small increments throughout the memory's life or may occur only a limited number of times during the memory life. In one example, read voltages and programming target voltages are increased by predetermined amounts in response to a determination that data quality is at a threshold level. For example, the threshold level may depend on the number of corrections needed, the number of iterations by an iterative decoder, or probability values for memory states when a high resolution read is performed.

In another example, adjustment may be made in response to a threshold number of erase operations being performed. Where an erase count is maintained for each block, the programming and reading voltages for the block may change when a certain erase count is reached. In such a system, different blocks use different programming and reading voltages and the memory system keeps track of which block has adjusted voltages using overhead bits within the block, or a table maintained by the controller, or in some other suitable manner using a dedicated circuit, a portion of the controller or other suitable structure. Such a system does not necessarily have an ECC decoder that determines quality of data.

Read voltages and programming target voltages may be changed together over the life of a memory. However, some changes to read voltages may be made without changing target voltages. For example, changes may be made to discrimination voltages to balance error corrections between adjacent states where the overall rate of correction is acceptable.

In general, when a read voltage is adjusted it remains at the adjusted voltage until a subsequent adjustment is made. However, in some cases it may be desirable to make a temporary adjustment in read voltage. For example, where data is read from a memory and is found to be of poor quality (e.g. low probability values or a high number of errors indicated by ECC), one or more read voltages may be adjusted in a manner determined by ECC correction of the poor quality data, and the data may be read again. This may allow better quality data to be obtained so that the data can be decoded. However, it may not be necessary to keep such read voltages at their adjusted levels. This scheme may be used for retrieving otherwise irretrievable data from a memory. Generally, such data is then rewritten to another location so that it does not degrade further. The original block may then be erased. This may be part of a scrub operation carried out by a memory controller or may occur as part of a regular read operation (e.g. in response to a host read command). Programming target voltages generally remain unchanged during an adjustment of this kind. Examples of error handling are given in U.S. Pat. Nos. 5,657,332 and 6,751,766.

Figure 11:
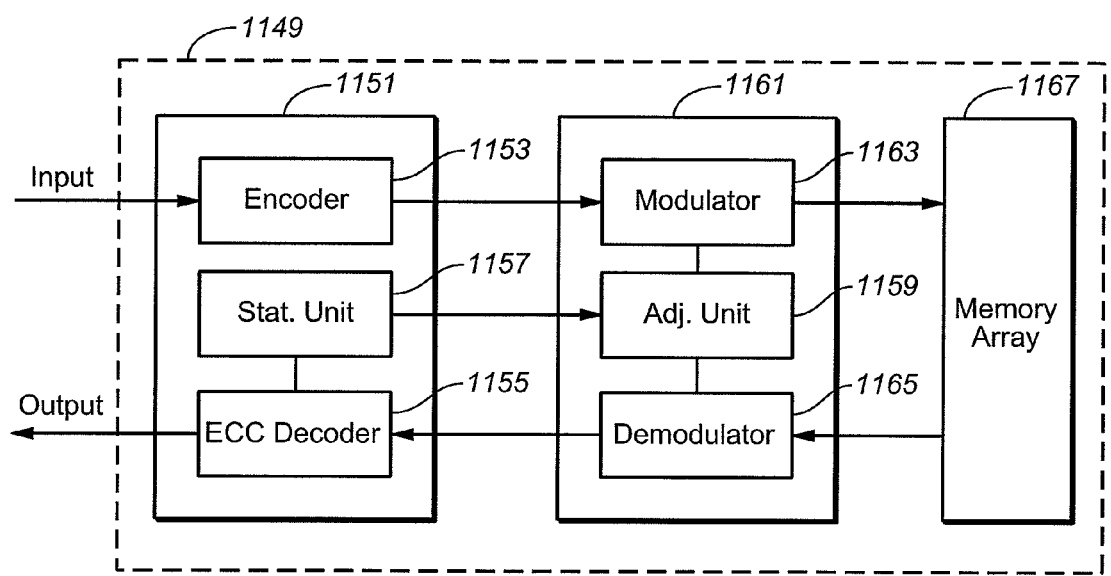
FIG. 11 shows a memory system including an ECC decoder, a statistical unit that gathers statistical information regarding corrections by the ECC decoder and an adjustment unit that adjusts operating parameters such as read voltages or programming target voltages in response to a signal from the statistical unit.

FIG. 11 shows a memory system 1149 according to an embodiment of the present invention that includes an ECC module 1151 that has an ECC encoder 1153, an ECC decoder 1155 and a statistical unit 1157. The statistical unit 1157 collects statistical information regarding the corrections carried out by the ECC decoder 1155. The ECC decoder 1155 may include a SISO decoder or a hard-input hard-output decoder, or may include both. In one example, a SISO decoder is concatenated with a hard-input hard-output decoder (the statistical unit may gather statistics regarding decoding by both decoders). Two encoding schemes may be used, such as an LDPC code for SISO decoding and a BCH code for hard-input hard-output decoding. The statistical unit may gather statistics that indicate overall quality of the data and may also indicate numbers of corrections being carried out by the ECC decoding system, or may indicate ratios of corrections between different memory states. An output of the statistical unit is provided to an adjustment unit 1159 in a modulation/demodulation circuit 1161. The adjustment unit 1159 makes appropriate changes to operating parameters used by a modulator 1163 in programming data to a memory array 1167 (e.g. target voltages for particular memory states) and operating parameters used by a demodulator 1165 in reading data from the memory array 1167 (e.g. read voltages).

The various examples above refer to flash memory. However, various other nonvolatile memories are currently in use and the techniques described here may be applied to any suitable nonvolatile memory systems. Such memory systems may include, but are not limited to, memory systems based on ferroelectric storage (FRAM or FeRAM), memory systems based on magnetoresistive storage (MRAM), and memories based on phase change (PRAM or "OUM" for "Ovonic Unified Memory").

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A flash memory system comprising:
    a flash memory array that includes a plurality of memory cells programmed to a plurality of programmed states;
    a reading circuit connected to the memory array, the reading circuit comparing a memory cell threshold voltage to a first plurality of predetermined voltages to distinguish the plurality of programmed states in a first mode and comparing the memory cell threshold voltage to a second plurality of predetermined voltages to distinguish the plurality of programmed states in a second mode, the highest one of the second plurality of predetermined voltages being higher than the highest one of the first plurality of predetermined voltages; and
    a programming circuit that programs cells to a first plurality of target voltages individually corresponding to programmed states in the first mode and programming cells to a second plurality of target voltages individually corresponding to programmed states in the second mode.

2. The flash memory system of claim 1 further comprising maintaining a record that indicates whether a portion of the memory array was programmed in the first mode or in the second mode.

3. The flash memory system of claim 1 wherein the highest one of the second plurality of target voltages is higher than the highest one of the first plurality of target voltages.

4. The flash memory system of claim 1 wherein the second plurality of target voltages are more widely spaced than the first plurality of target voltages.

5. The flash memory system of claim 1 wherein the reading circuit further distinguishes within individual ones of the plurality of programmed states to provide probability information regarding cell states.

6. The flash memory system of claim 1 further comprising a soft-input soft-output decoder.

7. The flash memory system of claim 6 wherein the flash memory system changes from the first mode to the second mode in response to a signal generated by the soft-input soft-output decoder.

8. The flash memory system of claim 1 further comprising an erase count indicator, and wherein the flash memory system changes from the first mode to the second mode when an erase count maintained by the erase count indicator exceeds a predetermined value.

9. The flash memory system of claim 1 wherein the flash memory system is in a removable memory card having a host interface.

10. The flash memory system of claim 1 wherein the first plurality of predetermined voltages define a first threshold voltage window, the second plurality of predetermined voltages define a second threshold voltage window, the second threshold voltage window being wider than the first threshold voltage window.

11. The flash memory system of claim 1 wherein each of the second plurality of predetermined voltages is more widely spaced from adjacent ones of the second plurality of voltages than a corresponding one of the first plurality of voltages is separated from adjacent ones of the first plurality of voltages.

12. The flash memory system of claim 1 wherein the second plurality of predetermined voltages are selected to balance error corrections between adjacent states.

13. The flash memory system of claim 1 wherein the reading circuit compares the memory cell threshold voltage to the first plurality of predetermined voltages in the first mode in response to a first host request for data, the reading circuit compares the memory cell threshold voltage to the second plurality of predetermined voltages in the second mode in response to a second host request for data.

* * * * *